(12) United States Patent
Kitaguchi

(10) Patent No.: US 6,585,853 B2
(45) Date of Patent: Jul. 1, 2003

(54) BONDING APPARATUS

(75) Inventor: Tetsuo Kitaguchi, Ishikawa (JP)

(73) Assignee: Shibuya Kogyo Co., Ltd., Ishikawa (JP)

( * ) Notice: Subject to any disclaimer, the term of this patent is extended or adjusted under 35 U.S.C. 154(b) by 155 days.

(21) Appl. No.: 09/922,722

(22) Filed: Aug. 7, 2001

(65) Prior Publication Data

US 2002/0017367 A1 Feb. 14, 2002

(30) Foreign Application Priority Data

Aug. 7, 2000 (JP) ........................................ 2000-238960

(51) Int. Cl.⁷ ................................................. B23K 1/06
(52) U.S. Cl. ..................................... 156/580.1; 228/1.1
(58) Field of Search ............................... 156/73.1, 362, 156/580, 580.1, 580.2; 228/1.1, 4.5, 110.1; 425/174.2

(56) References Cited

U.S. PATENT DOCUMENTS 5,385,288 A * 1/1995 Kyomasu et al. ............ 228/1.1
5,540,807 A * 7/1996 Akiike et al. ............... 156/580.1
6,073,827 A * 6/2000 Razon et al. ................. 228/4.5
6,286,747 B1 * 9/2001 Chan et al. ................... 228/1.1

FOREIGN PATENT DOCUMENTS

| DE | 198 28 637 A1 | 2/1999 | |
| JP | 63-229724 | 9/1988 | ........... H01L/21/52 |
| JP | 9-64085 | 3/1997 | |

OTHER PUBLICATIONS

Patent abstract of Japan 63–229724 Sep. 26, 1988.

* cited by examiner

Primary Examiner—James Sells
(74) Attorney, Agent, or Firm—Sughrue Mion, PLLC

(57) ABSTRACT

A bonding apparatus has a relay stage for a chip, a bonding head, and a substrate stage. The bonding head and the substrate stage are moved relatively so that the chip is bonded to the substrate. A delivery mechanism having a retention portion for retaining the chip and the substrate is provided movably relatively to the relay stage and the substrate stage. The chip retained by the retention portion is mounted onto the relay stage, while the substrate retained by the retention portion is mounted onto the substrate stage, or while the retention portion retains the substrate mounted on the substrate stage.

7 Claims, 2 Drawing Sheets

BONDING APPARATUS

BACKGROUND OF THE INVENTION

1. Field of the Invention

The present invention relates to an improvement of a bonding apparatus for bonding a chip to a substrate, and particularly relates to a bonding apparatus characterized by a delivery mechanism for moving a chip and a substrate onto a relay stage and a substrate stage respectively.

The present application is based on Japanese Patent Application No. 2000-238960, which is incorporated herein by reference.

2. Description of the Related Art

Conventionally, there have been some bonding apparatus for feeding chips and substrates, bonding them, and storing completed articles. For example, a bonding apparatus disclosed in Unexamined Japanese Patent Publication No. Sho. 63-229724 comprises means for moving a chip from a chip tray to a chip pre-alignment portion (corresponding to a relay stage), means for moving a substrate from a substrate tray to a substrate pre-alignment portion, and means for moving the substrate and a completed article (the substrate which has been bonded with the chip, hereinafter referred to as "completed substrate") from the substrate pre-alignment portion to a bonding stage (corresponding to a substrate stage) and from the bonding stage to a completed-article storage tray respectively.

However, since the bonding apparatus had respective means for moving the chip, the substrate and the completed substrate (the substrate which had been bonded with the chip), there were some problems that the manufacturing cost of the bonding apparatus increased and the size of the bonding apparatus also enlarged.

SUMMARY OF THE INVENTION

It is an object of the present invention to implement the means for moving the chip and the substrate by a single delivery mechanism so as to reduce the manufacturing cost of the bonding apparatus while making the bonding apparatus compact.

According to the present invention, the bonding apparatus employs the following constitution.

First, a bonding apparatus comprises: a relay stage for mounting a chip thereon temporarily; a bonding head for holding the chip on the relay stage and bonding the chip on a substrate; and a substrate stage for mounting the substrate thereon, the bonding head and the substrate stage being moved relatively so as to position the chip and the substrate so that the chip is bonded to the substrate.

Second, a delivery mechanism having a retention portion for retaining the chip and the substrate is provided movably relatively to the relay stage and the substrate stage.

Third, the delivery mechanism functions to mount the chip retained by the retention portion onto the relay stage, while the delivery mechanism further function to mount the substrate retained by the retention portion onto the substrate stage, or while the delivery mechanism further functions to make the retention portion retain the substrate mounted on the substrate stage.

Features and advantages of the invention will be evident from the following detailed description of the preferred embodiments described in conjunction with the attached drawings.

DETAILED DESCRIPTION OF THE PREFERRED EMBODIMENTS

Figure 1:
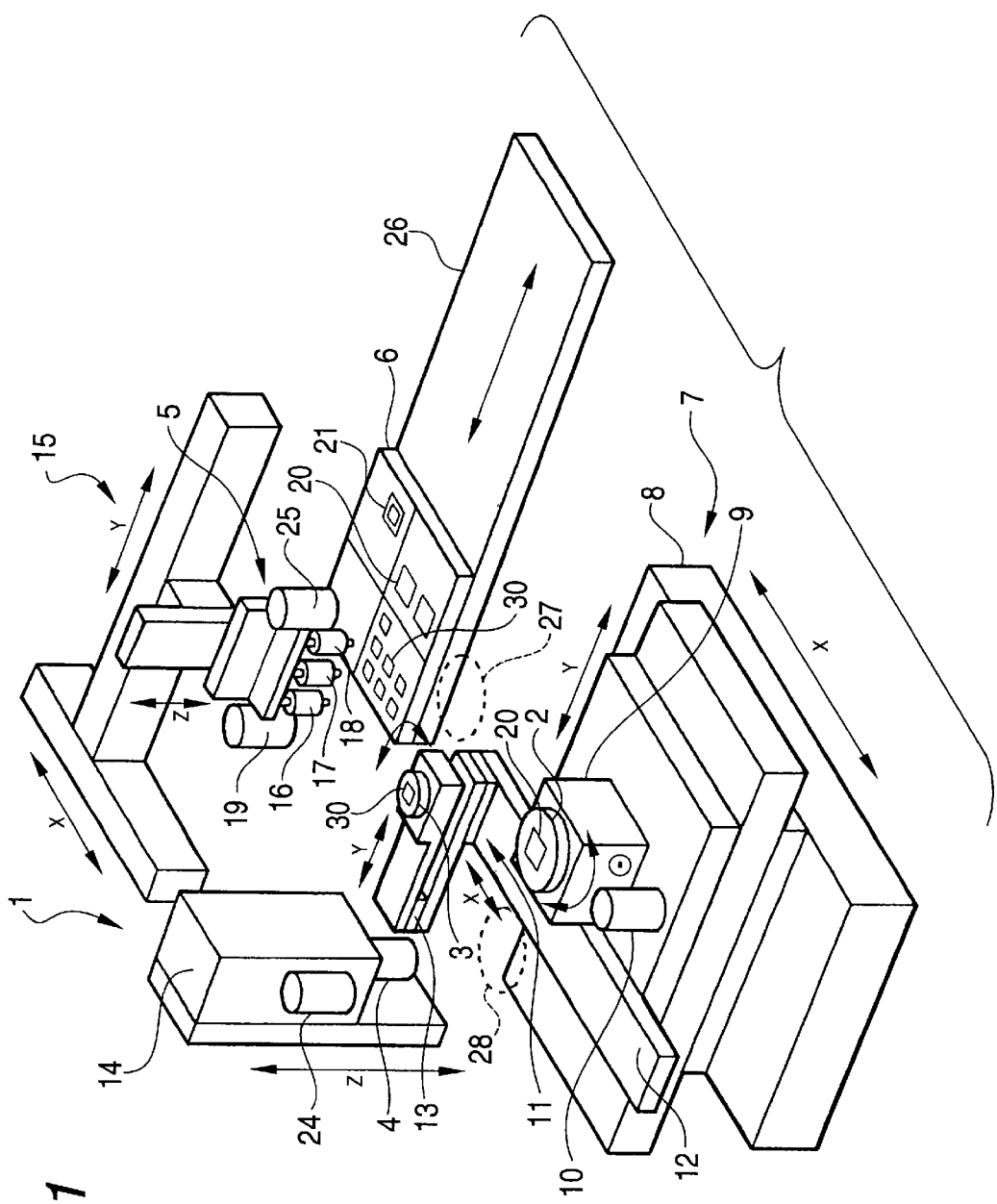
FIG. 1 shows a schematic perspective view showing an embodiment of a bonding apparatus.

A mode for carrying out the invention along with its embodiment will be described below with reference to the drawings. FIG. 1 is a schematic perspective view showing an embodiment of a bonding apparatus. A bonding apparatus 1 has, as main parts, a substrate stage 2, a relay stage 3, a bonding head 4, a pick and place unit 5 which functions as a delivery mechanism, and a storage tray 6 for storing chips 30, substrates 20 and completed substrates 21.

The substrate stage 2 has a first moving mechanism 7 for moving the substrate stage 2. The first moving mechanism 7 is constituted by an XY table mechanism 8 and a Θ-axis drive mechanism 9. The XY table mechanism 8 can move in the direction of an X-axis direction which is hereinafter referred to as an "X-direction" and which is a horizontal direction along which the substrate stage 2 comes close to or goes away from the storage tray 6, and in the direction of Y-axis which is hereinafter referred to as a "Y-direction" and which is a direction perpendicular to the X-direction, that is a horizontal direction along which the substrate stage 2 advances to or recedes from a bonding position 28. The Θ-axis drive mechanism 9 is provided to rotate the substrate stage 2. Incidentally, a chip recognition camera 10 is provided on the XY table mechanism 8.

A second moving mechanism 11 is provided on the XY table mechanism 8. The second moving mechanism 11 allows the relay stage 3 to move horizontally in the X-direction and in the Y-direction independently of the movement of the substrate stage 2. The second moving mechanism 11 is constituted by an X-axis moving table mechanism 12 and a Y-axis moving table mechanism 13 as shown in FIG. 1. The relay stage 3 is provided on the Y-axis moving table mechanism 13. A chip 30 carried by the pick and place unit 5 is mounted on the relay stage 3 temporarily and then delivered to the bonding head 4.

The bonding head 4 sucks and holds the chip 30 on the relay stage 3, and moves down to a substrate 20 on the substrate stage 2 so that the chip 30 is bonded to the substrate 20. The bonding head 4 has a Z-axis drive mechanism 14. Thus, the bonding head 4 can move up/down between a retracted position (the position of the bonding head 4 in FIG. 1) and the substrate stage 2 located in the bonding position 28 under the retracted position. Incidentally, a substrate recognition camera 24 moving synchronously with the bonding head 4 by the Z-axis drive mechanism 14 is provided in the vicinity of the bonding head 4.

The pick and place unit 5 acting as a delivery mechanism has a third moving mechanism 15 for moving the pick and place unit 5. The third moving mechanism 15 can move the pick and place unit 5 in the X-direction, the Y-direction and the Z-direction which is perpendicular to both the X-direction and the Y-direction, as indicated by respective arrows in FIG. 1. Thus, the pick and place unit 5 delivers the chip 20, the substrate 20 and the completed substrate 21 between the storage tray 6 and the delivery position 27.

Figure 2:
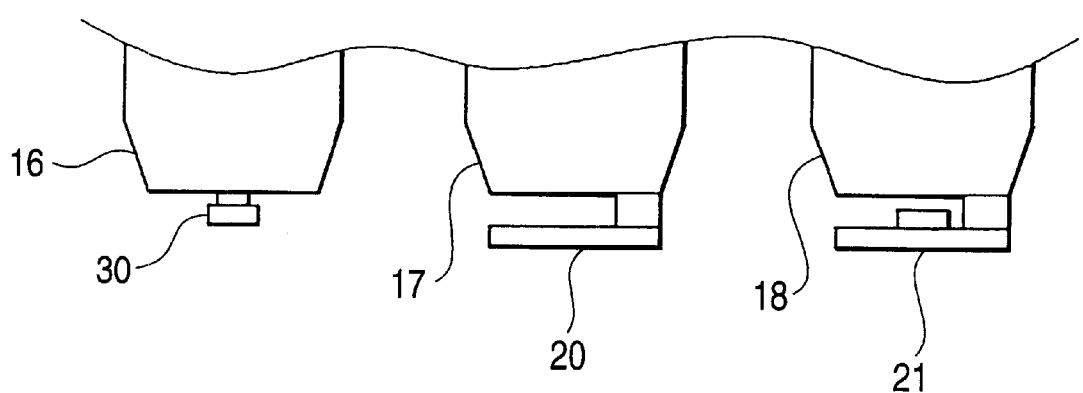
FIG. 2 shows a partially enlarged explanatory view showing three retention tools of a pick and place unit.

A retention portion for retaining a chip or a substrate is formed in the pick and place unit 5. In this embodiment, as shown in FIG. 2, the retention portion is constituted by a chip sucking/retaining tool 16, a substrate sucking/retaining tool 17 and a completed-substrate sucking/retaining tool 18. The chip sucking/retaining tool 16 sucks the center of the upper surface of the chip 30. On the other hand, each of the substrate sucking/retaining tool 17 and the completed-substrate sucking/retaining tool 18 is designed to suck the substrate 20 at an offset position which is away from the place where the chip 30 is to be bonded or has been bonded. The chip sucking/retaining tool 16 may be omitted in accordance with the size of the chip 30. In such a case, the chip 30 is sucked by the substrate sucking/retaining tool 17 or the completed-substrate sucking/retaining tool 18. Incidentally, a chip recognition camera 19 and a substrate recognition camera 25 for recognizing the chip 30 and the substrate 20 on the storage tray 6 respectively are attached to the pick and place unit 5.

The storage tray 6 for storing the chips 30, the substrates 20 and the completed substrates 21 is mounted on a tray conveyor 26. When the chips 30 and the substrates 20 supplied by the storage tray 6 have been bonded, the storage tray 6 is conveyed out.

Description will be made below about the operation of the bonding apparatus 1. First, in the condition that the relay stage 3 is located in a first delivery position 27, the pick and place unit 5 recognizes a chip 30 on the storage tray 6 through the chip recognition camera 19, thereafter moves down and retains the chip 30 by the chip sucking/retaining tool 16. In addition, the pick and place unit 5 recognizes a substrate 20 on the storage tray 6 through the substrate recognition camera 25, thereafter moves down and retains the substrate 20 by the substrate sucking/retaining tool 17. In this condition, the pick and place unit 5 retains the chip 30 and the substrate 20.

Second, the pick and place unit 5 moves above the relay stage 3 located in the delivery position 27, and moves down to deliver the chip 30 to the relay stage 3. The chip 30 is subjected to Θ-adjustment (adjustment of the rotation angle) on the relay stage 3. At this time, in the pick and place unit 5, only the substrate 20 is retained by the substrate sucking/retaining tool 17.

Third, the second moving mechanism 11 is driven so that the relay stage 3 moves to the bonding position 28 which is a second delivery position to deliver the chip 30 to the bonding head 4. At the same time, the first moving mechanism 7 is driven so that the substrate stage 2 moves to the delivery position 27.

Fourth, the bonding head 4 moves down to suck and hold the chip 30 on the relay stage 3 located in the bonding position 28 which is the second delivery position. On the other hand, the pick and place unit 5 delivers the retained substrate 20 to the substrate stage 2. At this time, when delivering the substrate 20, the pick and place unit 5 rotates the substrate sucking/retaining tool 17 by a not-shown Θ-axis drive mechanism so as to adjust the direction of the sucked substrate 20 and deliver the adjusted substrate 20. Then, the bonding head 4 sucks and holds the chip 30 while the pick and place unit 5 retains nothing.

Fifth, the pick and place unit 5 recognizes another chip 30 on the storage tray 6 through the chip recognition camera 19, and retains the chip 30 by the chip sucking/retaining tool 16. In addition, the pick and place unit 5 recognizes another substrate 20 on the storage tray 6, and retains the substrate 20 by the substrate sucking/retaining tool 17. On the other hand, the first moving mechanism 7 is driven so that the substrate stage 2 moves to the bonding position 28. At the same time, the second moving mechanism 11 is driven so that the relay stage 3 moves to the delivery position 27, At this time, the pick and place unit 5 retains the chip 30 and the substrate 20.

Sixth, the first moving mechanism 7 is driven so that the substrate 20 on the substrate stage 2 located in the bonding position 28 is recognized by the substrate recognition camera 24 provided on the side of the bonding head 4. The chip 30 held by the bonding head 4 is recognized by the chip recognition camera 10 provided on the XY table mechanism 8 of the substrate stage 2. Then, the substrate stage 2 is moved in the X-, Y- and Θ-directions so that the substrate 20 and the chip 30 are positioned. After that, the bonding head 4 moves down to bond the chip 30 to the substrate 20.

During the bonding, the pick and place unit 5 delivers another chip 30 to the relay stage 3 located in the delivery position 27, and Θ-adjustment is carried out on the relay stage 3. At this time, the bonding head 4 does not hold any chip 30, while the pick and place unit 5 retains a substrate 20.

Seventh, the second moving mechanism 11 is driven so that the relay stage 3 moves to the bonding position 28. At the same time, the first moving mechanism 7 is driven so that the substrate stage 2 moves to the delivery position 27.

Eighth, the bonding head 4 holds the chip 30 on the relay stage 3 located in the bonding position 28. In addition, the pick and place unit 5 receives, by the completed-substrate sucking/retaining tool 18, a completed substrate 21 on the substrate stage 2 located in the delivery stage 27. Then, the pick and place unit 5 delivers the substrate 20 retained in advance by the substrate sucking/retaining tool 17 onto the substrate stage 2. At this time, the bonding head 4 sucks and holds the chip 30 while the pick and place unit 5 retains the completed substrate 21 by the completed-substrate sucking/retaining tool 18. In such a manner, when the pick and place unit 5 receives the completed substrate 21, the pick and place unit 5 beforehand retains the substrate 20 to be delivered next. Thus, the tact time is shortened.

Ninth, the first moving mechanism 7 is driven so that the substrate stage 2 moves to the bonding position 28, and the second moving mechanism 11 is driven so that the relay stage 3 moves to the delivery position 27. The pick and place unit 5 puts the completed substrate 21 onto the storage tray 6, recognizes another chip 30 on the storage tray 6 and retains the chip 30. In addition, the pick and place unit 5 recognizes another substrate 20 on the storage tray 6 and retains the substrate 20. Then, the pick and place unit 5 retains the chip 30 and the substrate 20 while the bonding head 4 sucks and holds another chip 30.

When one cycle of the bonding operation is terminated in the ninth operation step, the sixth to ninth operation steps are carried out repeatedly. Incidentally, in this embodiment, the substrate stage 2 and the relay stage 3 are located in the same delivery position 27 by the first and second moving mechanisms 7 and 11 respectively. Thus, the operation range can be reduced even with the single pick and place unit 5, and the pick and place unit 5 itself can be miniaturized.

The operation steps were described about the case where one chip 30 was bonded to one substrate 20. Not to say, a plurality of chips 30 can be bonded to one substrate 20. In such a case, the following steps are added after the sixth operation step.

As a first additional operation step, the substrate stage 2 recedes from the bonding position 28, and the relay stage 3 moves to the bonding position 28.

As a second additional operation step, the bonding head 4 sucks and holds the chip 30 on the relay stage 4. On the other hand, the pick and place unit 5 recognizes another chip 30 on the storage tray 6, and retains the chip 30. Then, the bonding head 4 holds a chip 30 while the pick and place unit 5 retains another chip 30 and a substrate 20.

In a third additional operation step, the substrate stage 2 moves to the bonding position 28, and the relay stage 3 moves to the delivery position 27. After that, the operation moves to the sixth operation step again, that is, the bonding step. Such steps are repeated by the number of times corresponding to the number of chips to be bonded to the substrate 20. Then, the operation moves to the seventh step et seq.

With such a configuration, the present invention shows effects as follows.

First, a delivery mechanism having retention portions for retaining a chip and a substrate respectively is provided movably relatively to a relay stage and a substrate stage. The chip retained in the chip retention portion is mounted on the relay stage while the substrate retained in the substrate retention portion is mounted on the substrate stage. Alternatively, a completed substrate mounted on the substrate stage is retained in a completed-substrate retention portion. Thus, the chip and the substrate can be conveyed and mounted by the single delivery mechanism. It is therefore possible to reduce the manufacturing cost of the bonding apparatus while making the bonding apparatus compact.

When the completed substrate subjected to bonding and mounted on the substrate stage is retained in the completed-substrate retention portion, the substrate retention portion retains another substrate which has not been bonded and which is to be subjected to bonding next. Thus, the next substrate can be mounted on the substrate stage while the completed substrate is retained. Accordingly, in spite of the single delivery mechanism, the tact time can be shortened in comparison with the conventional example in which a completed substrate and a next substrate are moved from a substrate stage to a completed-article tray and from a substrate pre-alignment portion to a substrate stage respectively.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A bonding apparatus comprising:
   a relay stage for mounting a chip thereon temporarily;
   a bonding head for holding said chip on said relay stage and bonding said chip on a substrate;
   a substrate stage for mounting said substrate thereon, said bonding head and said substrate stage being moved relatively thereby bonding said chip to said substrate; and
   a delivery mechanism having a retention portion for retaining said chip and said substrate and being movably provided relatively to said relay stage and said substrate stage;
   wherein said delivery mechanism functions to mount said chip retained by said retention portion onto said relay stage, and after that (i) to mount said substrate retained by said retention portion onto said substrate stage or (ii) to make said retention portion retain said substrate mounted on said substrate stage.

2. A bonding apparatus according to claim 1, wherein said retention portion includes a chip retention portion and a substrate retention portion.

3. A bonding apparatus according to claim 1, wherein said retention portion includes at least a substrate retention portion for retaining said substrate which has not been bonded yet, and a completed-substrate retention portion for retaining said substrate which has been bonded.

4. A bonding apparatus according to claim 1, further comprising:
   a first moving mechanism for moving said substrate stage horizontally; and
   a second moving mechanism for moving said relay stage horizontally;
   wherein said moving mechanisms are controlled so that said relay stage is located in a delivery position of said delivery mechanism when said substrate stage is in a bonding position, and said substrate stage is located in said delivery position of said delivery mechanism when said relay stage is in said delivery position where said chip is delivered to said bonding head.

5. A bonding apparatus comprising:
   a relay stage for mounting a chip thereon temporarily;
   a bonding head for holding said chip on said relay stage and bonding said chip on a substrate;
   a substrate stage for mounting said substrate thereon, said bonding head and said substrate stage being moved relatively thereby bonding said chip to said substrate; and
   a delivery mechanism being provided movably relatively to said relay stage and said substrate stage, said delivery mechanism including a substrate retention portion for retaining said substrate which has not been bonded yet, and a completed-substrate retention portion for retaining said substrate which has been bonded;
   wherein said delivery mechanism makes said substrate retention portion retain another substrate which has not been bonded and which is to be bonded next while said delivery mechanism makes said completed-substrate retention portion retain said completed substrate which has been bonded and mounted on said substrate stage.

6. A bonding apparatus according to claim 5, wherein said delivery mechanism further includes a chip retention portion.

7. A bonding apparatus according to claim 5, further comprising:
   a first moving mechanism for moving said substrate stage horizontally; and
   a second moving mechanism for moving said relay stage horizontally;
   wherein said moving mechanisms are controlled so that said relay stage is located in a delivery position of said delivery mechanism when said substrate stage is in a bonding position, and said substrate stage is located in said delivery position of said delivery mechanism when said relay stage is in said delivery position where said chip is delivered to said bonding head.

* * * * *